(12) United States Patent
Liao et al.

(10) Patent No.: US 11,024,552 B2
(45) Date of Patent: Jun. 1, 2021

(54) DEVICE ARRANGEMENT STRUCTURE ASSEMBLY HAVING ADHESIVE TAPE LAYER

(71) Applicant: TAIWAN SEMICONDUCTOR MANUFACTURING COMPANY, LTD., Hsinchu (TW)

(72) Inventors: Chun Hao Liao, Hsinchu (TW); Chu Fu Chen, Zhubei (TW); Mingo Liu, Hsinchu (TW); Chiou Jun Yean, Jhudong Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/739,941

(22) Filed: Jan. 10, 2020

(65) Prior Publication Data
US 2020/0152526 A1    May 14, 2020

Related U.S. Application Data

(62) Division of application No. 15/193,542, filed on Jun. 27, 2016, now Pat. No. 10,535,572.

(Continued)

(51) Int. Cl.
*H01L 23/58*    (2006.01)
*H01L 29/10*    (2006.01)
(Continued)

(52) U.S. Cl.
CPC .............. *H01L 22/14* (2013.01); *H01L 22/34* (2013.01); *H01L 25/0753* (2013.01);
(Continued)

(58) Field of Classification Search
CPC ....... H01L 22/14; H01L 25/165; H01L 22/34; H01L 2933/0033; H01L 25/0753;
(Continued)

(56) References Cited

U.S. PATENT DOCUMENTS 6,130,543 A     10/2000  Iino
6,621,155 B1 *  9/2003   Perino .................. H01L 23/3128
                                                            257/686

(Continued)

FOREIGN PATENT DOCUMENTS

CN          102623480          8/2012

OTHER PUBLICATIONS

Office Action dated Aug. 4, 2020 from corresponding application No. TW 106105645.

*Primary Examiner* — Ismail A Muse
(74) *Attorney, Agent, or Firm* — Hauptman Ham, LLP

(57) ABSTRACT

An assembly includes a wafer having a top wafer surface and a wafer circumference. The assembly further includes a device arrangement structure. The device arrangement structure includes a first surface having a perimeter, the perimeter being encircled by the wafer circumference in a plan view; and an array of devices, each device of the array of devices having an electrical contact on the first surface. The assembly further includes an adhesive element configured to affix the device arrangement structure in a stationary position relative to the wafer, wherein the adhesive element includes a tape layer having an adhesive surface attached to the top surface of the device arrangement structure and attached to a surface of the wafer.

20 Claims, 3 Drawing Sheets

Related U.S. Application Data

(60) Provisional application No. 62/323,007, filed on Apr. 15, 2016.

(51) Int. Cl.
| | |
|---|---|
| *H01L 21/66* | (2006.01) |
| *H01L 25/16* | (2006.01) |
| *H01L 25/075* | (2006.01) |
| *G01R 31/26* | (2020.01) |
| *H01L 33/00* | (2010.01) |

(52) U.S. Cl.
CPC ........ *H01L 25/165* (2013.01); *G01R 31/2635* (2013.01); *H01L 33/0093* (2020.05); *H01L 33/0095* (2013.01); *H01L 2933/0033* (2013.01)

(58) Field of Classification Search
CPC ............ H01L 33/0079; H01L 33/0095; G01R 31/2635; G01N 35/00; G01N 35/00584
See application file for complete search history.

(56) References Cited

U.S. PATENT DOCUMENTS

| | | | |
|---|---|---|---|
| 6,974,726 B2* | 12/2005 | Dani | H01L 21/78 |
| | | | 257/620 |
| 8,110,423 B2* | 2/2012 | Okabe | H01L 33/0095 |
| | | | 438/33 |
| 2004/0112880 A1* | 6/2004 | Sekiya | B23K 26/364 |
| | | | 219/121.69 |
| 2005/0003635 A1 | 1/2005 | Takekoshi | |
| 2005/0130392 A1 | 6/2005 | Feng | |
| 2005/0205136 A1 | 9/2005 | Freeman | |
| 2006/0192575 A1 | 8/2006 | Kasukabe | |
| 2008/0076233 A1* | 3/2008 | Morishige | B23K 26/009 |
| | | | 438/463 |
| 2010/0255657 A1 | 10/2010 | Priewasser | |
| 2010/0267219 A1* | 10/2010 | Kajiyama | B23K 26/0853 |
| | | | 438/462 |
| 2011/0050269 A1 | 3/2011 | Miyazono | |
| 2012/0051155 A1* | 3/2012 | Chung | H01L 25/0657 |
| | | | 365/189.07 |
| 2012/0106197 A1* | 5/2012 | Lai | B32B 37/12 |
| | | | 362/609 |
| 2012/0206160 A1 | 8/2012 | Wu | |
| 2012/0228646 A1* | 9/2012 | Kuo | H01L 25/0753 |
| | | | 257/88 |
| 2013/0001405 A1 | 1/2013 | Walker | |
| 2013/0015859 A1 | 1/2013 | Tseng | |
| 2013/0076384 A1 | 3/2013 | Chang | |
| 2013/0119275 A1 | 5/2013 | Solarz | |
| 2013/0169300 A1 | 7/2013 | Ishikawa | |
| 2013/0193571 A1 | 8/2013 | Huang | |
| 2013/0240832 A1 | 9/2013 | Hersee | |
| 2013/0264710 A1 | 10/2013 | Osugi | |
| 2014/0051189 A1 | 2/2014 | Kai-Jun | |
| 2014/0159732 A1 | 6/2014 | Wu | |
| 2014/0295593 A1 | 10/2014 | Tseng | |
| 2014/0347490 A1 | 11/2014 | Takayama | |
| 2015/0061718 A1 | 3/2015 | Chan | |
| 2015/0137842 A1 | 5/2015 | Murakami | |
| 2015/0137844 A1 | 5/2015 | Kikuchi | |
| 2015/0221603 A1 | 8/2015 | Ooi | |
| 2015/0255381 A1* | 9/2015 | Kim | H01L 25/0655 |
| | | | 257/676 |
| 2015/0311391 A1 | 10/2015 | Chen | |
| 2016/0064626 A1 | 3/2016 | Chen | |
| 2016/0087165 A1 | 3/2016 | Lee | |
| 2016/0216321 A1 | 7/2016 | Edwards | |
| 2016/0225960 A1 | 8/2016 | Tischler | |
| 2016/0240415 A1 | 8/2016 | Sekiya | |
| 2016/0262268 A1 | 9/2016 | Co | |
| 2017/0067857 A1 | 3/2017 | Oonuki | |
| 2017/0069796 A1 | 3/2017 | Lin | |
| 2019/0103315 A1* | 4/2019 | Iwamoto | H01L 21/6836 |

* cited by examiner

DEVICE ARRANGEMENT STRUCTURE ASSEMBLY HAVING ADHESIVE TAPE LAYER

RELATED APPLICATIONS

This application is a divisional application of U.S. application Ser. No. 15/193,542, filed on Jun. 27, 2016, which claims the priority of U.S. Provisional Application No. 62/323,007, filed Apr. 15, 2016, which are incorporated herein by reference in their entireties.

BACKGROUND

Because semiconductor devices are commonly manufactured on circular wafers having industry standard diameters, automated test systems capable of efficient collection of large quantities of test data are typically configured to handle circular wafers having those diameters.

In a number of applications, including light emitting diode (LED) display technology, devices are arranged in structures that do not conform to an industry standard, circular wafer. These devices are commonly tested using manual or semi-automated methods that are less efficient than fully automated testing of standard sized circular wafers.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
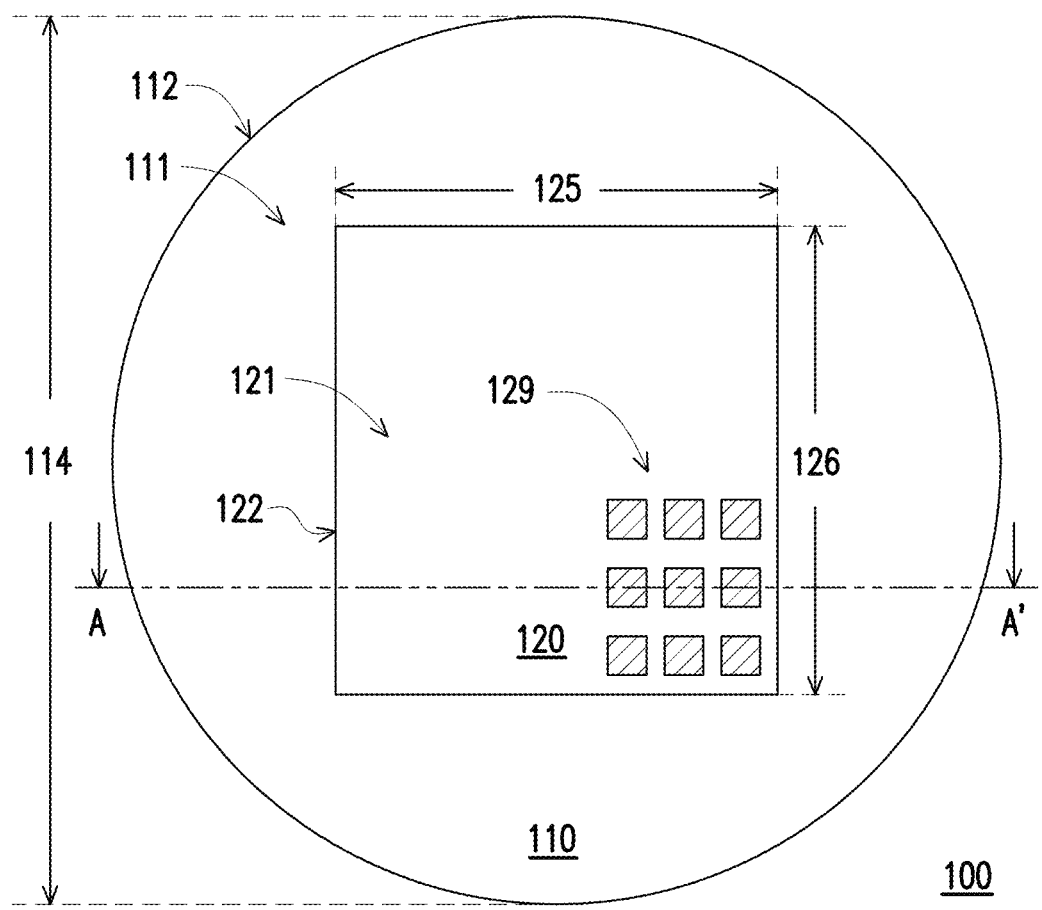
FIGS. 1A and 1B are diagrams of an assembly, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a test assembly includes a device arrangement structure, a wafer having a top wafer surface and a wafer diameter, and an adhesive element that affixes the device arrangement structure in a stationary position relative to the wafer. The device arrangement structure includes a first surface having a perimeter, the perimeter being encircled by a wafer circumference in a plan view.

The device arrangement structure also includes an array of devices, each device of the array of devices having an electrical contact on the first surface. The array of devices is thereby electrically accessible at the first surface and capable of being tested using a test system configured for fully automated testing of wafers having the wafer diameter.

Figure 1B:
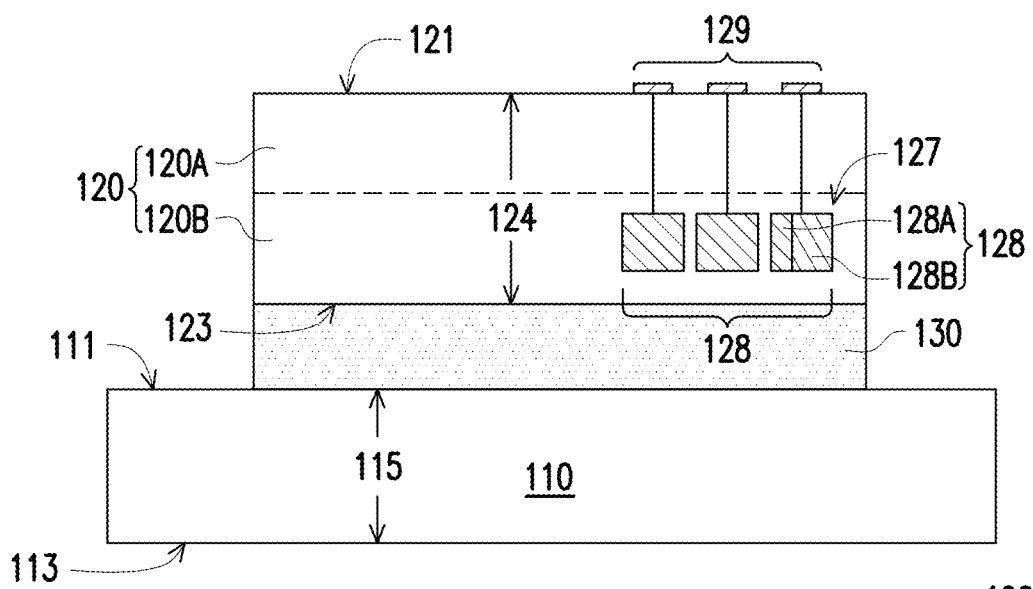

FIGS. 1A and 1B are diagrams of an assembly 100, in accordance with some embodiments. FIG. 1A depicts a plan view of assembly 100 and FIG. 1B depicts a cross-sectional view of assembly 100 through cut line A-A'. Assembly 100 includes a wafer 110, a device arrangement structure 120, and an adhesive layer 130 (adhesive element) between wafer 110 and device arrangement structure 120.

Wafer 110 has a top wafer surface 111, a circumference 112, a bottom wafer surface 113, a diameter 114, and a thickness 115. In some embodiments, wafer 110 comprises silicon. In various embodiments, wafer 110 comprises materials such as compound semiconductor materials or insulating materials such as glass that are capable of having a rigid structure.

In some embodiments, wafer 110 is an unprocessed wafer. In some embodiments, wafer 110 is a wafer that has undergone one or more manufacturing processes. In some embodiments, wafer 110 comprises one or more of a dopant, a metal, or an oxide.

Top wafer surface 111 is one of two flat surfaces of wafer 110, and bottom wafer surface 113 is the other one of the two flat surfaces of wafer 110. In some embodiments, one or both of top wafer surface 111 and bottom wafer surface 113 is a substantially planar surface.

Circumference 112 is a substantially circular shape. In some embodiments, circumference 112 is a circle having a notch (not shown) that, in use, is recognized by an automated test system for orientation during wafer handling. In some embodiments, circumference 112 is a circle having a flat segment (not shown) that, in use, is recognized by an automated test system for orientation during wafer handling. In some embodiments, circumference 112 is a circle having any irregular segment that, in use, is recognized by an automated test system for orientation during wafer handling. In some embodiments, circumference 112 is an uninterrupted circle.

Diameter 114 is the maximum distance between two opposite points of the circular portion or entirety of circumference 112. In some embodiments, diameter 114 is 200 millimeters (mm). In some embodiments, diameter 114 is 300 mm. In some embodiments, diameter 114 is a distance corresponding to an industry standard for wafer manufacturing, handling, and testing.

Thickness 115 is the distance between top wafer surface 111 and bottom wafer surface 113. In some embodiments, thickness 115 ranges from 500 micrometers (μm) to 1000 μm. In some embodiments, thickness 115 ranges from 700 μm to 800 μm. In some embodiments, thickness 115 is less than 500 μm. In some embodiments, thickness 115 is greater than 1000 μm. In some embodiments, thickness 115 is a distance corresponding to an industry standard for wafer manufacturing, handling, and testing.

Device arrangement structure 120 has a first surface 121 having a perimeter 122, and a second surface 123 separated from first surface 121 by a thickness 124. In some embodiments, perimeter 122 is a rectangle having a width 125 and a height 126. In some embodiments, width 125 and height 126 have the same value and perimeter 122 is a square. In some embodiments, width 125 and height 126 have different values.

In some embodiments, perimeter 122 is a non-rectangular shape and width 125 and height 126 represent maximum distances between points in perimeter 122 in respective horizontal and vertical directions. In some embodiments, perimeter 122 is a circle having a diameter that does not correspond to an industry standard, and width 125 and height 126 represent the non-standard diameter.

First surface 121 and second surface 123 are substantially flat and parallel to each other such that thickness 124 is substantially uniform across at least a portion of device arrangement structure 120. First surface 121 and second surface 123 are parallel to top wafer surface 111. In some embodiments, thickness 124 ranges from 1 mm to 10 mm. In some embodiments, thickness 124 ranges from 2 mm to 5 mm. In some embodiments, thickness 124 is less than 1 mm. In some embodiments, thickness 124 is greater than 10 mm.

In some embodiments, one or both of width 125 and height 126 ranges from 50 mm to 200 mm. In some embodiments, one or both of width 125 and height 126 is approximately 100 mm. In some embodiments, one or both of width 125 and height 126 is less than 50 mm. In some embodiments, one or both of width 125 and height 126 is greater than 200 mm.

The largest dimension of a width, height, diagonal, or diameter of perimeter 122 is smaller than diameter 114. Device arrangement structure 120 is positioned relative to wafer 110 such that, in a plan view, wafer circumference 112 encircles perimeter 122.

Device arrangement structure 120 includes an array of devices 127. Device arrangement structure 120 is a solid configured to hold each device 128 of the array of devices 127 in a fixed position. In some embodiments, device arrangement structure 120 comprises glass. In some embodiments, device arrangement structure 120 is an LED device structure for an LED display and the array of devices 127 is a plurality of LED devices. In some embodiments, device arrangement structure 120 includes one or more circuits and/or devices in addition to the array of devices 127.

Each device 128 of the array of devices 127 has an electrical contact 129 on first surface 121. In some embodiments, each device 128 of the array of devices 127 has a plurality of electrical contacts 129 on first surface 121. In some embodiments, more than one device 128 shares an electrical contact 129. In some embodiments, a device 128 has an electrical contact (not shown) in addition to electrical contact 129, a non-limiting example being an electrical contact on second surface 123.

In some embodiments, electrical contact 129 comprises a metal pad. In some embodiments, electrical contact 129 comprises a pad comprising aluminum. In some embodiments, electrical contact 129 comprises a transparent conductive material, non-limiting examples of which include zinc oxide (ZnO), indium-tin mixed oxide (ITO), antimony-tin mixed oxide (ATO), fluorine-doped tin oxide (FTO), and aluminum-doped zinc oxide (AlZO).

By having an electrical contact 129 on first surface 121, each device 128 is electrically accessible at first surface 121 such that device 128 is capable of being electrically tested through the electrical contact 129.

Device 128 is an electrical circuit or a combination of an electrical circuit and another component. In some embodiments, an electrical circuit is a semiconductor circuit. In some embodiments, the array of devices 127 comprises a number of devices 128 that ranges from 1,000 to 100,000. In some embodiments, the array of devices 127 comprises a number of devices 128 less than 1,000. In some embodiments, the array of devices 127 comprises a number of devices 128 greater than 100,000.

In some embodiments, at least one device 128 of the array of devices 127 comprises a first component 128A and a second component 128B. In some embodiments, each device 128 of the array of devices 127 comprises a first component 128A and a second component 128B. In some embodiments, first component 128A comprises an LED. In some embodiments, first component 128A comprises a plurality of LEDs. In some embodiments, second component 128B comprises a control circuit for an LED. In some embodiments, second component 128B comprises a control circuit for a plurality of LEDs. In some embodiments, first component 128B does not have an electrical contact 129 on first surface 121 and second component 128B has an electrical contact 129 on first surface 121.

In some embodiments, device arrangement structure 120 includes a first layer 120A and a second layer 120B. In various embodiments, first layer 120A comprises a transparent conductive material, non-limiting examples of which include ZnO, ITO, ATO, FTO, and AlZO.

In some embodiments, second layer 120B comprises a glass material such as silicon dioxide ($SiO_2$). In some embodiments, second layer 120B comprises the array of devices 127.

In some embodiments, adhesive layer 130 comprises a glue or other adhesive material capable of maintaining device arrangement structure 120 in a stationary position relative to wafer 110. Adhesive layer 130 contacts wafer 110 at top wafer surface 111 and contacts device arrangement structure 120 at second surface 123. In some embodiments, adhesive layer 130 contacts one or both of wafer 110 and device arrangement structure 120 at one or more additional surfaces.

In some embodiments, adhesive layer 130 comprises an adhesive material having adhesive properties responsive to temperature changes such that, in operation, device arrangement structure 120 is mounted to wafer 110 and/or dismounted from wafer 110 at an elevated temperature with respect to a temperature of a test or manufacturing environment.

In some embodiments, adhesive layer 130 comprises an adhesive material capable of being cured such that, in operation, the adhesive material is applied to top wafer surface 111 and/or second surface 123 as a liquid or paste and cured to be configured to maintain the position of device arrangement structure 120 relative to wafer 110.

In some embodiments, adhesive layer 130 comprises an adhesive material capable of being dissolved such that device arrangement structure 120 is capable of being dismounted from wafer 110 by a solvent.

In some embodiments, adhesive layer 130 comprises one or more sections of a tape having a top adhesive surface in contact with second surface 123 and a bottom adhesive surface in contact with top wafer surface 111.

In some embodiments, adhesive layer 130 contacts an entirety of top wafer surface 111. In some embodiments, adhesive layer 130 contacts a portion of top wafer surface 111. In some embodiments, adhesive layer 130 contacts multiple portions of top wafer surface 111.

In some embodiments, adhesive layer 130 contacts an entirety of second surface 123. In some embodiments, adhesive layer 130 contacts a portion of second surface 123.

In some embodiments, adhesive layer 130 contacts multiple portions of second surface 123.

Figure 2A:
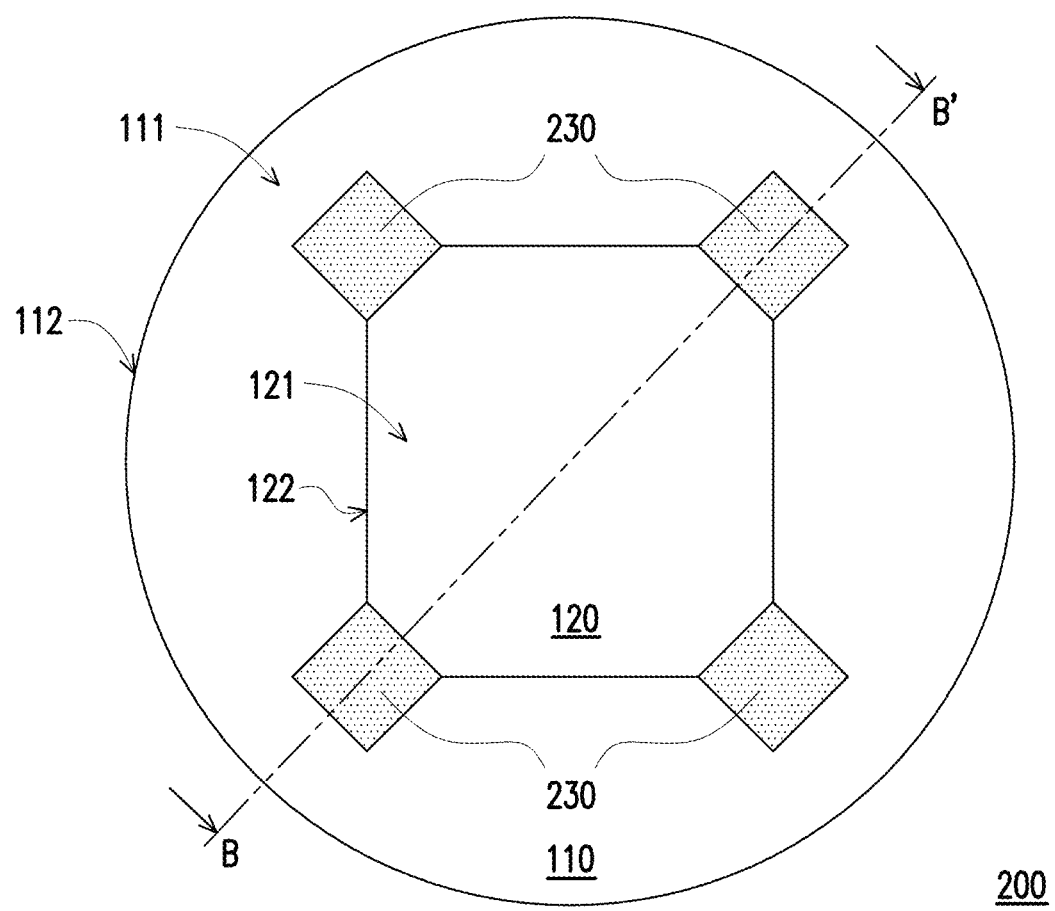
FIGS. 2A and 2B are diagrams of an assembly, in accordance with some embodiments.
Figure 2B:
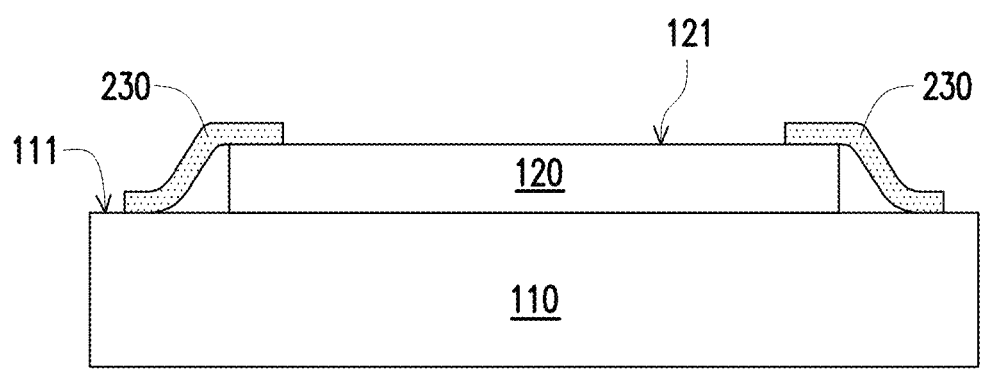

FIGS. 2A and 2B are diagrams of an assembly 200, in accordance with some embodiments. FIG. 2A depicts a plan view of assembly 200 and FIG. 2B depicts a cross-sectional view of assembly 200 through cut line B-B'. Assembly 200 includes wafer 110 and device arrangement structure 120, discussed above with respect to assembly 100. Although a number of features of wafer 110 and device arrangement structure 120 are not depicted in FIGS. 2A and 2B, assembly 200 is understood to include the features of wafer 110 and device arrangement structure 120 discussed above with respect to assembly 100.

In some embodiments, such as those depicted in FIG. 2B, assembly 200 does not include adhesive layer 130. In some embodiments, assembly 200 includes adhesive layer 130.

Assembly 200 includes a tape layer 230 (adhesive element). Tape layer 230 is one or more sections of a tape having an adhesive surface. The adhesive surface of tape layer 230 contacts a portion of top wafer surface 111 and a portion of first surface 121. In some embodiments, the adhesive surface of tape layer 230 contacts one or both of wafer 110 and device arrangement structure 120 at one or more additional surfaces.

In some embodiments, tape layer 230 has mechanical and adhesive strength such that tape layer 230 is capable of maintaining device arrangement structure 120 in a stationary position relative to wafer 110. In some embodiments in which assembly 200 includes adhesive layer 130, the combination of adhesive layer 130 and tape layer 230 has mechanical and adhesive strength such that the combination of adhesive layer 130 and tape layer 230 is capable of maintaining device arrangement structure 120 in a stationary position relative to wafer 110.

In some embodiments, first surface 121 has a rectangular perimeter 122 and tape layer 230 comprises four tape layers, each tape layer corresponding to a corner of perimeter 122. In some embodiments, tape layer 230 comprises fewer than four tape layers. In some embodiments, tape layer 230 comprises more than four tape layers.

Figure 3:
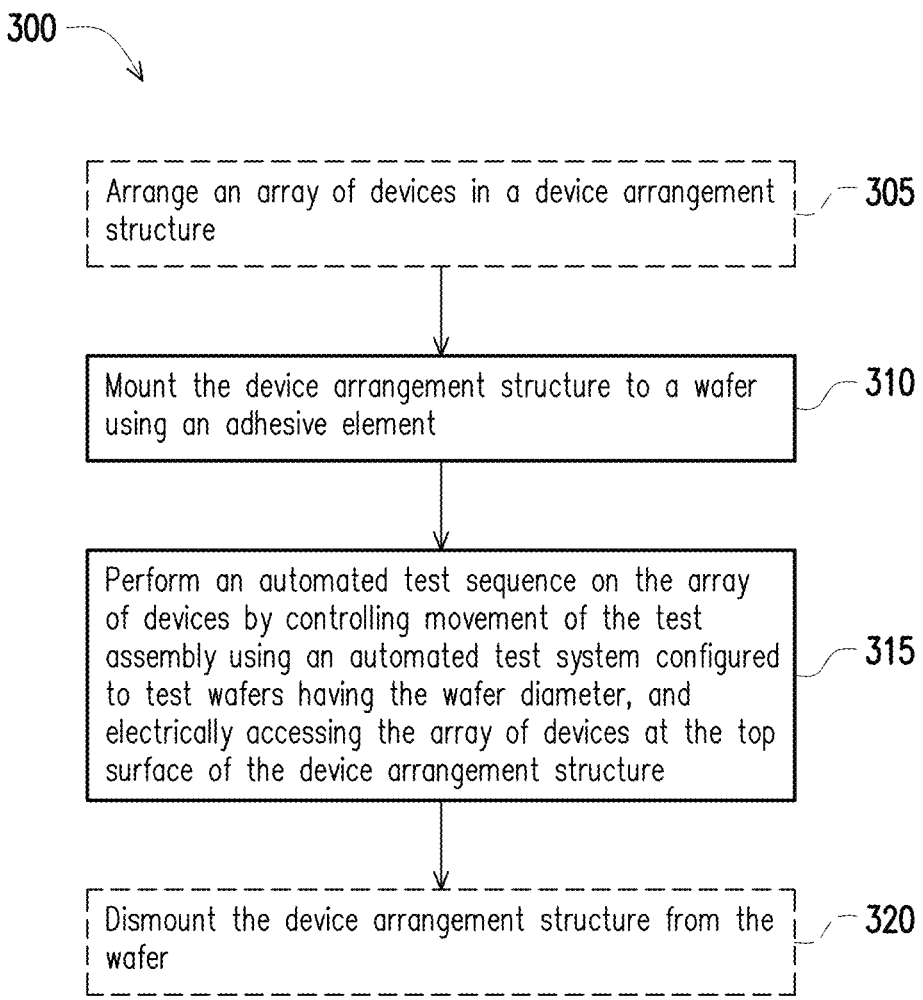
FIG. 3 is a flow chart of a method of testing a test assembly, in accordance with some embodiments.

FIG. 3 is a flow chart of a method 300 of testing a test assembly. Method 300 is capable of being performed with an assembly 100 or an assembly 200, described above with respect to FIGS. 1A and 1B and 2A and 2B, respectively.

In some embodiments, method 300 includes operation 305, at which devices are arranged in a device arrangement structure. In some embodiments, arranging the devices includes arranging devices 127 in device arrangement structure 120. In some embodiments, arranging the devices includes arranging LED devices on an LED device structure that is part of an LED display.

At operation 310, the device structure is mounted on a wafer having a diameter that corresponds to an industry standard. Mounting the device structure on a wafer includes using an adhesive element to form a test assembly. In some embodiments, using the adhesive element includes applying an adhesive layer between the device structure and the wafer. In some embodiments, using the adhesive element includes applying adhesive layer 130 between second surface 123 of device arrangement structure 120 and top wafer surface 111 of wafer 110. In some embodiments, using the adhesive element includes applying adhesive layer 130 to one or both of second surface 123 of device arrangement structure 120 and top wafer surface 111 of wafer 110. In some embodiments, applying an adhesive layer includes using an elevated temperature relative to a temperature of a test or manufacturing environment. In some embodiments, applying an adhesive layer includes curing the adhesive layer.

In some embodiments, using the adhesive element includes applying a tape layer to a top surface of the device arrangement structure and to a surface of the wafer. In some embodiments, using the adhesive element includes applying tape layer 230 to top surface 121 of device arrangement structure 120 and to top wafer surface 111 of wafer 110.

Mounting the device structure to the wafer includes mounting the device structure including the array of devices being electrically accessible at the top surface of the device arrangement structure.

At operation 315, an automated test sequence is performed on the array of devices. Performing the automated test sequence includes controlling movement of the test assembly using an automated test system configured to test wafers having the wafer diameter. Performing the automated test sequence also includes electrically accessing the array of devices at the top surface of the device arrangement structure.

In some embodiments, performing the automated test sequence includes executing a functional test on a device. In some embodiments, performing the automated test sequence includes executing an electrical test to measure an electrical property of a device, non-limiting examples of which include resistance, conductance, capacitance, leakage current, and threshold voltage.

In some embodiments, performing the automated test sequence includes executing software routines on the test system. In some embodiments, executing the software routines on the test system includes executing software routines that are designed to be executed on wafers having the wafer diameter. In some embodiments, performing the automated test sequence includes executing a wafer acceptance test (WAT) routine. In some embodiments, performing the automated test sequence includes executing a circuit probe (CP) routine.

In some embodiments, at least one device of the array of devices comprises an LED and a control circuit, and performing the automated test sequence comprises performing an electrical test of at least one control circuit of the at least one device.

In some embodiments, controlling movement of the test assembly using the automated test system includes automatically positioning a device of the array of devices under a test fixture. In some embodiments, the test fixture includes a probe pin configured make an electrical connection with an electrical contact on the top surface of the device arrangement structure. In some embodiments, the test fixture includes an array of probe pins configured to have a given probe pin make an electrical connection with a corresponding electrical contact on the top surface of the device arrangement structure.

In some embodiments, the test assembly is one test assembly of a plurality of test assemblies numbering from 20 to 30. In some embodiments, the test assembly is one test assembly of a plurality of test assemblies numbering fewer than 20. In some embodiments, the test assembly is one test assembly of a plurality of test assemblies numbering greater than 30.

In some embodiments, the test assembly is one test assembly of a plurality of test assemblies and controlling movement of the test assembly using the automated test system includes automatically loading each test assembly of the plurality of test assemblies onto a moveable test platform in contact with a bottom surface of the wafer. In some embodiments, controlling movement of the test assembly using the automated test system includes automatically retrieving each test assembly of the plurality of test assemblies from a wafer container configured to store wafers having the wafer diameter. In some embodiments, controlling movement of the test assembly using the automated test system includes automatically storing each test assembly of the plurality of test assemblies in a wafer container configured to store wafers having the wafer diameter.

In some embodiments, the test assembly is one test assembly of a plurality of test assemblies and performing the automated test sequence on the array of devices includes storing test data for each assembly of the plurality of test assemblies. In some embodiments, storing test data for each assembly of the plurality of test assemblies includes storing an identifier for each assembly of the plurality of test assemblies. In some embodiments, storing test data for each assembly of the plurality of test assemblies includes storing location data for one or more devices of the array of devices. In some embodiments, storing test data for each assembly of the plurality of test assemblies includes storing test outcome data for one or more devices of the array of devices, non-limiting examples of test outcomes including pass-fail status and comparison to a threshold value.

In some embodiments, electrically accessing the array of devices at the top surface of the device arrangement structure includes electrically accessing an entirety of the array of devices. In some embodiments, electrically accessing the array of devices at the top surface of the device arrangement structure includes electrically accessing a subset of the array of devices.

In some embodiments, a device has a plurality of electrical contacts at the top surface of the device arrangement structure and electrically accessing the array of devices at the top surface of the device arrangement structure includes accessing each electrical contact of the plurality of electrical contacts. In some embodiments, a device has a plurality of electrical contacts at the top surface of the device arrangement structure and electrically accessing the array of devices at the top surface of the device arrangement structure includes accessing a subset of the plurality of electrical contacts.

In some embodiments, method 300 includes operation 320, at which the device arrangement structure is dismounted from the wafer. In some embodiments, dismounting the device arrangement structure from the wafer includes applying heat to the test assembly. In some embodiments, dismounting the device arrangement structure from the wafer includes applying a solvent to the test assembly.

By mounting device arrangement structures on wafers to form test assemblies, devices electrically accessible at top surfaces of the device arrangement structures can be tested using automated test systems configured for the wafers. For multiple test assemblies, efficiency is thereby improved by as much as 90% in comparison to manual or semi-automated testing. Automatically obtaining and linking test data to specific devices also facilitates data analysis.

An aspect of this description relates to an assembly. The assembly includes a wafer having a top wafer surface and a wafer circumference. The assembly further includes a device arrangement structure. The device arrangement structure includes a first surface having a perimeter, the perimeter being encircled by the wafer circumference in a plan view; and an array of devices, each device of the array of devices having an electrical contact on the first surface. The assembly further includes an adhesive element configured to affix the device arrangement structure in a stationary position relative to the wafer, wherein the adhesive element includes a tape layer having an adhesive surface attached to the top surface of the device arrangement structure and attached to a surface of the wafer. In some embodiments, the adhesive element includes an adhesive layer between the top wafer surface and the device arrangement structure. In some embodiments, the perimeter is a rectangle; and the adhesive element includes four tape layers, each tape layer of the four tape layers contacting the top wafer surface and the first surface at a corner of the rectangle. In some embodiments, at least one device of the array of devices is a semiconductor circuit including a light emitting diode (LED).

An aspect of this description relates to an assembly. The assembly includes a wafer having a top wafer surface and a circular wafer circumference. The assembly further includes a light emitting diode (LED) device structure. The LED device structure includes a first surface having a perimeter, the perimeter being a rectangle having dimensions smaller than a diameter of the wafer circumference; a second surface parallel to the first surface and the top wafer surface and between the first surface and the top wafer surface; and a plurality of LED devices, at least one LED device of the plurality of LED devices having an electrical contact on the first surface. The assembly further includes an adhesive element configured to affix the LED device structure in a stationary position relative to the wafer, wherein the adhesive element comprises a tape layer having an adhesive surface attached to the top surface of the LED device structure and attached to a surface of the wafer. In some embodiments, the at least one LED device of the plurality of LED devices includes an LED and a control circuit; and the electrical contact on the first surface is an electrical contact to the control circuit. In some embodiments, the LED device structure includes a first layer comprising a transparent conductive material and having the first surface; and a second layer comprising a glass material and having the second surface. In some embodiments, the second layer includes the plurality of LED devices. In some embodiments, the adhesive element includes an adhesive layer between the top wafer surface and the second surface.

An aspect of this disclosure relates to an assembly. The assembly includes a wafer having a top wafer surface. The assembly includes a device arrangement structure. The device arrangement structure includes a first surface, wherein the first surface is a farthest surface of the device arrangement structure from the wafer; and an array of devices, each device of the array of devices having an electrical contact on the first surface. The assembly further includes a plurality of adhesive elements configured to affix the device arrangement structure in a stationary position relative to the wafer, wherein a first adhesive element of the plurality of adhesive elements includes a tape layer having an adhesive surface attached to the first surface and attached to the top wafer surface. In some embodiments, a second adhesive element of the plurality of adhesive elements is between the wafer and the device arrangement structure. In some embodiments, the second adhesive element covers an entirety of the top wafer surface. In some embodiments, the first adhesive element is over a first edge of the device arrangement structure, and a second adhesive element of the plurality of adhesive elements is over a second edge, different from the first edge, of the device arrangement structure. In some embodiments, the device arrangement structure includes a first layer and a second layer, and the second layer is between the wafer and the first layer. In some embodiments, the first layer includes a transparent conductive material. In some embodiments, the transparent conductive material includes at least one of ZnO, ITO, ATO, FTO or AlZO. In some embodiments, the second layer includes a glass material. In some embodiments, the array of devices is in the second layer, and the contact is on the first layer. In some embodiments, a device of the array of devices includes a light emitting diode (LED); and a control circuit electrically connected to the LED. In some embodiments, the plurality of adhesive elements includes an adhesive element over each corner of the device arrangement structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An assembly comprising:
a wafer having a top wafer surface and a wafer circumference;
a device arrangement structure comprising:
a first surface having a perimeter, the perimeter being encircled by the wafer circumference in a plan view; and
an array of devices, each device of the array of devices having an electrical contact on the first surface; and
an adhesive element configured to affix the device arrangement structure in a stationary position relative to the wafer, wherein the adhesive element comprises a tape layer having an adhesive surface attached to a top surface of the device arrangement structure and attached to a surface of the wafer, and the adhesive element comprises an adhesive layer between the top wafer surface and the device arrangement structure.

2. The assembly of claim 1, wherein:
the perimeter is a rectangle; and
the adhesive element further comprises four tape layers, each tape layer of the four tape layers contacting the top wafer surface and the first surface at a corner of the rectangle.

3. The assembly of claim 1, wherein at least one device of the array of devices is a semiconductor circuit comprising a light emitting diode (LED).

4. The assembly of claim 3, wherein the at least one device further comprises a circuit for controlling the LED.

5. An assembly comprising:
a wafer having a top wafer surface and a circular wafer circumference;
a light emitting diode (LED) device structure comprising:
a first surface having a perimeter, the perimeter being a rectangle having dimensions smaller than a diameter of the wafer circumference;
a second surface parallel to the first surface and the top wafer surface and between the first surface and the top wafer surface; and
a plurality of LED devices, at least one LED device of the plurality of LED devices having an electrical contact on the first surface; and
an adhesive element configured to affix the LED device structure in a stationary position relative to the wafer, wherein the adhesive element comprises a tape layer having an adhesive surface attached to the top surface of the LED device structure and attached to a surface of the wafer.

6. The assembly of claim 5, wherein:
the at least one LED device of the plurality of LED devices comprises an LED and a control circuit; and
the electrical contact on the first surface is an electrical contact to the control circuit.

7. The assembly of claim 5, wherein the LED device structure comprises:
a first layer comprising a transparent conductive material and having the first surface; and
a second layer comprising a glass material and having the second surface.

8. The assembly of claim 7, wherein the second layer comprises the plurality of LED devices.

9. The assembly of claim 5, wherein the adhesive element comprises an adhesive layer between the top wafer surface and the second surface.

10. An assembly comprising:
a wafer having a top wafer surface;
a device arrangement structure comprising:
a first surface, wherein the first surface is a farthest surface of the device arrangement structure from the wafer; and
an array of devices, each device of the array of devices having an electrical contact on the first surface, wherein a device of the array of devices comprises a light emitting diode (LED); and
a plurality of adhesive elements configured to affix the device arrangement structure in a stationary position relative to the wafer, wherein a first adhesive element of the plurality of adhesive elements comprises a tape layer having an adhesive surface attached to the first surface and attached to the top wafer surface.

11. The assembly of claim 10, wherein a second adhesive element of the plurality of adhesive elements is between the wafer and the device arrangement structure.

12. The assembly of claim 11, wherein the second adhesive element covers an entirety of the top wafer surface.

13. The assembly of claim 10, wherein the first adhesive element is over a first edge of the device arrangement structure, and a second adhesive element of the plurality of adhesive elements is over a second edge, different from the first edge, of the device arrangement structure.

14. The assembly of claim 10, wherein the device arrangement structure comprises a first layer and a second layer, and the second layer is between the wafer and the first layer.

15. The assembly of claim 14, wherein the first layer comprises a transparent conductive material.

16. The assembly of claim 15, wherein the transparent conductive material includes at least one of ZnO, ITO, ATO, FTO or AlZO.

17. The assembly of claim 14, wherein the second layer comprises a glass material.

18. The assembly of claim 14, wherein the array of devices is in the second layer, and the contact is on the first layer.

19. The assembly of claim 10, wherein the device of the array of devices further comprises:
   a control circuit electrically connected to the LED.

20. The assembly of claim 10, wherein the plurality of adhesive elements comprises an adhesive element over each corner of the device arrangement structure.

\* \* \* \* \*